United States Patent [19]

Dery et al.

[11] Patent Number: 4,659,872

[45] Date of Patent: Apr. 21, 1987

[54] FLEXIBLE FLAT MULTICONDUCTOR CABLE

[75] Inventors: Ronald A. Dery; William G. Gentry; Warren C. Jones; Clifton C. May, Jr., all of Winston-Salem; Steven G. Wentink, Kernersville, all of N.C.

[73] Assignee: AMP Incorporated, Harrisburg, Pa.

[21] Appl. No.: 728,956

[22] Filed: Apr. 30, 1985

[51] Int. Cl.$^4$ ............................................. H01B 7/08
[52] U.S. Cl. .............................. 174/117 A; 174/72 C;
  174/117 FF; 174/117 PC
[58] Field of Search .......... 174/72 C, 117 FF, 117 A,
  174/117 PC

[56] References Cited

U.S. PATENT DOCUMENTS

| | | | |
|---|---|---|---|
| Re. 31,411 | 10/1983 | Bolon et al. | 252/501.1 |
| 2,808,352 | 10/1957 | Coleman et al. | 174/177 A |
| 3,391,246 | 7/1968 | Freeman et al. | 174/117 FF |
| 3,475,213 | 10/1969 | Stow | 174/117 A |
| 3,514,326 | 5/1970 | Stow | 174/117 A |
| 3,704,164 | 11/1972 | Travis | 174/117 FF |
| 3,762,946 | 10/1973 | Stow et al. | 174/117 A |
| 3,778,306 | 12/1973 | Stow | 174/A X |
| 4,113,981 | 9/1978 | Fujita et al. | 174/88 R |
| 4,243,455 | 1/1981 | Shiba et al. | 156/187 |
| 4,368,281 | 1/1983 | Brummett et al. | 174/68.5 X |
| 4,401,843 | 8/1983 | Harper et al. | 174/72 B |
| 4,423,435 | 12/1983 | Test, II | 357/65 |
| 4,425,263 | 1/1984 | Nazarenko | 252/511 |
| 4,446,059 | 5/1984 | Eustice | 252/512 |

OTHER PUBLICATIONS

"Tape Connectors", *Circuit Manufacturing*, Mar. 1984, p. 24.
"Packaging News", Electronic Packaging & Production, Apr. 1, 1984, p. 11.
"Scotchlink Connector Tape", advertisement, Electronic Products, Aug. 15, 1984.
U.S. patent application Ser. No. 657,717, filed 10/4/84.
U.S. patent application Ser. No. 657,851, filed 10/4/84.

*Primary Examiner*—A. T. Grimley
*Assistant Examiner*—Morris H. Nimmo
*Attorney, Agent, or Firm*—Robert W. Pitts; Katherine A. Nelson

[57] ABSTRACT

A flat multiconductor cable having a multilayer construction and especially suited for use in establishing interconnections between the cable conductors and a separate conductive array such as a similar flat cable is disclosed. Conductive ink, formed metal conductors or etched conductors can be deposited on a flexible substrate and covered by a dielectric covering in the form of an ultraviolet cured dielectric coating or a separate insulating film. The conductors can be covered by anisotropic conductive adhesive with the conductive adhesive in contact with the underlying conductors at exposed tap locations where no dielectric coating is deposited or where the dielectric coating has been removed. A separate conductive array can be positioned in registry with the tap locations and the conductive adhesive can be used both to secure the conductive array to the cable and to establish electrical continuity between corresponding conductors.

24 Claims, 20 Drawing Figures

FLEXIBLE FLAT MULTICONDUCTOR CABLE

BACKGROUND OF THE INVENTION

1. Field of the Invention

This invention relates to multiconductor flat cable used in electrical circuitry and more particularly to a flat cable configuration which can easily be interconnected with circuits in a separate multiconductor flat cable or the like.

2. Description of the Prior Art

Flexible flat cable is employed in electrical and electronic equipment such as business machines, industrial controls, communication systems and computers. For example flexible flat cable jumper assemblies constituting insulated flat conductors having terminals or connectors attached at one or both ends comprise a common method of interconnecting separate components or separate circuits in assemblies such as printed circuit boards. These cable interconnections can be made by employing crimp-type contacts which eliminate flat cable preparation, stripping and conductor plating. Solder tab contacts can also be employed.

Conventional flat cable comprises a laminated assembly having an insulating material on opposite sides of conductors disposed therebetween. Such flat cable assemblies commonly employ polyester, polyvinyl, polyimide, polyetherimide, or polycarbonate insulating films. The conductors sandwiched therebetween in the laminate and comprise flat metallic conductors, such as flat copper. Etched conductors deposited on one substrate of the flat cable can also be employed. Such conventional cables commonly employ an adhesive to bond the two insulating layers together.

Conventional multiconductor flat cable permit interconnection between separate electrical components within a small size, since the conductors can be positioned on the flat cable at a relatively close center line spacing. For example such multiconductor cables are commonly available on 0.050 center line spacings. Conventional electrical connectors are available for use in interconnecting such conventional cables, on these center line spacings, but the tap connectors have a relatively high profile when compared to the cables. Thus the connectors limit the density of the package, by adding to the thickness of the assembled configuration. If a large number of taps is to be made to a single cable, the assembly can be relatively bulky due to the presence of the connectors. A low profile tap cable and a method of fabricating such a cable is therefore highly desirable.

SUMMARY OF THE INVENTION

The cable depicted in the preferred embodiments of this invention comprises a multiconductor flat cable having a single flexible insulating substrate with a plurality of conductors disposed side by side thereon. A dielectric coating which in one embodiment of the invention can comprise a dielectric ink comprising a photopolymer can be disposed along the surface of the conductors. The conductors can comprise separate etched or formed metal conductors, such as discrete copper conductors or the conductors can comprise a conductive ink formed from a solidified polymer having conductive material freely dispersed therein. Conventional substrates such as polyester film, polyetherimide, polyvinyl, polyimide film and polycarbonate film can be employed in such cable. The conductive and dielectric inks employed in one embodiment of this invention are screen printable and the dielectric ink can be curable upon the application of ultraviolet light. In this one embodiment of the invention the conductive ink can be formed of a conductive material containing a solvated polyester resin.

In the preferred embodiments of this invention a tap connection to corresponding conductors in a separate flat cable or other conductor array can be established by using a conductive adhesive which is screen printable on one or both of the cables. In this tap configuration openings in the dielectric covering can be positioned in registry with selected conductors. A conductive adhesive located at these tap locations can then be used to establish the interconnection. Both pressure sensitive and heat actuated conductive adhesives can be employed for this purpose. When a dielectric ink is used to establish the dielectric cover, the coverlay can be screen printed with the openings in registry with conductors at desired locations along the length of the cable. When a separate film dielectric cover is employed, the openings can be laser cut. Thus this invention permits an adhesive solderless tap connection to be established between two flat cables or between a cable and a conductor array without the use of separate terminals and connectors, thus precluding the dimensional restrictions inherent in solder or solderless connector interconnection techniques. Furthermore, the cable in accordance with this invention can be easily and efficiently manufactured.

DESCRIPTION OF THE PREFERRED EMBODIMENTS

Figure 1:
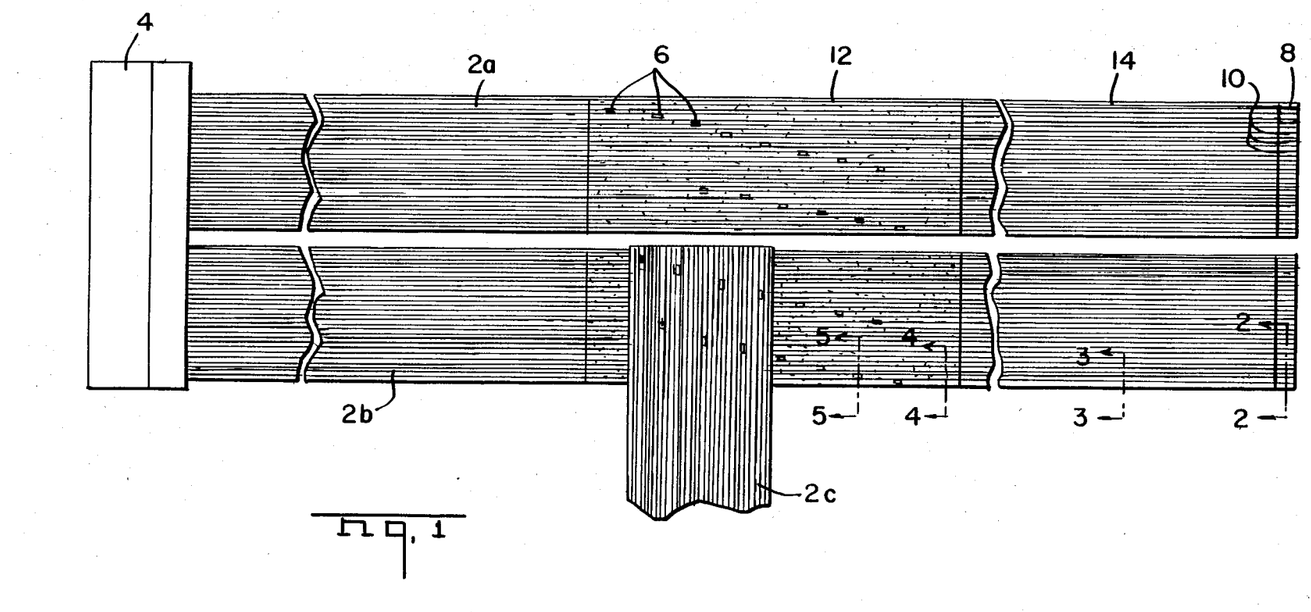
FIG. 1 is a top plan view of a cable with conductive ink traces and embodying the principles of this invention.
Figure 6:
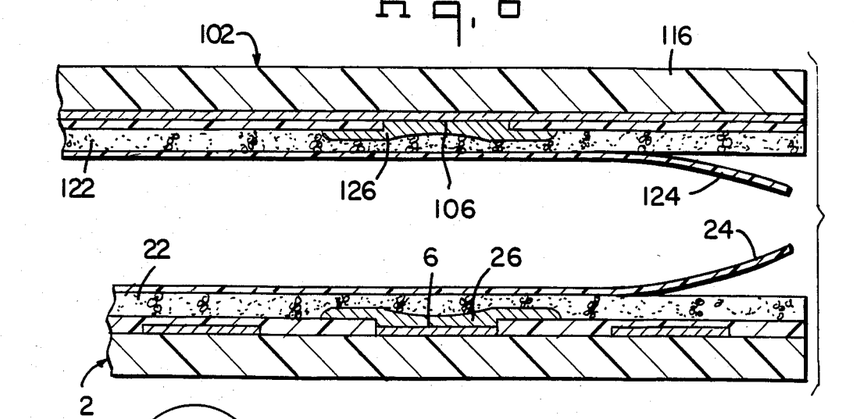
FIG. 6 is an exploded sectional view showing two similarly constructed cables prior to mating.
Figure 7:
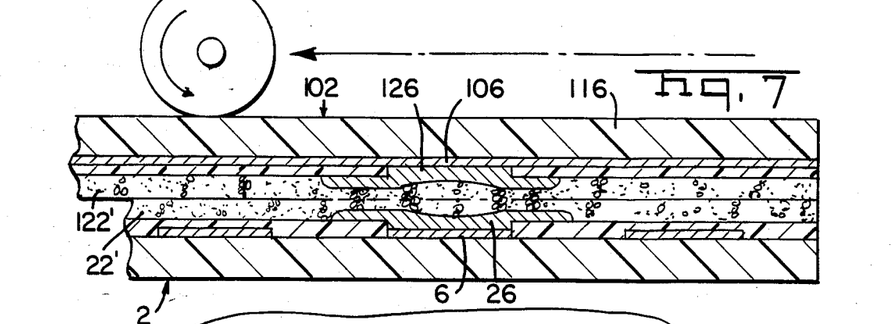
FIG. 7 is a view similar to FIG. 6 but showing two cables interconnected by a pressure-sensitive conductive adhesive.
Figure 8:
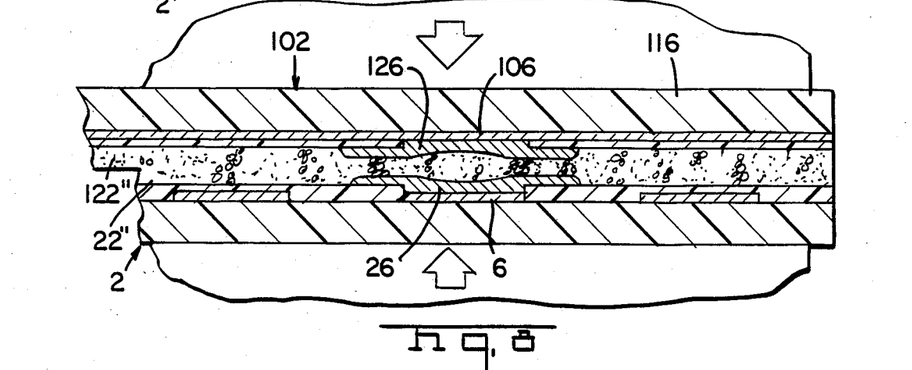
FIG. 8 is a view similar to FIG. 7 but showing the use of a heat-activated conductive adhesive.
Figure 9:
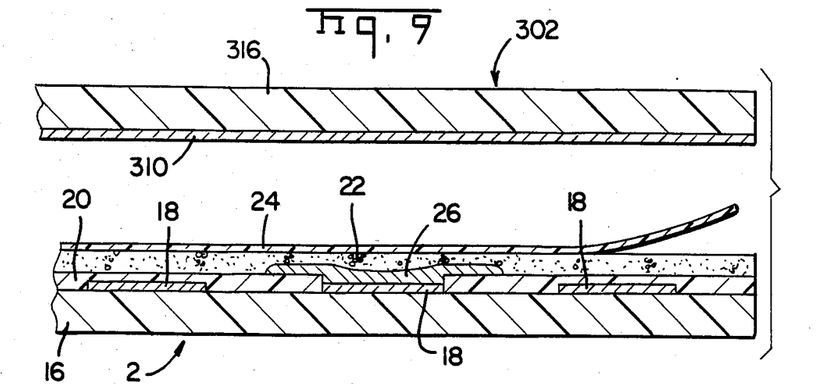
FIG. 9 is an exploded cross-sectional view showing the cable of FIG. 1 ready to be mated to a conductor array comprising only a substrate and conductor traces disposed thereon.
Figure 10:
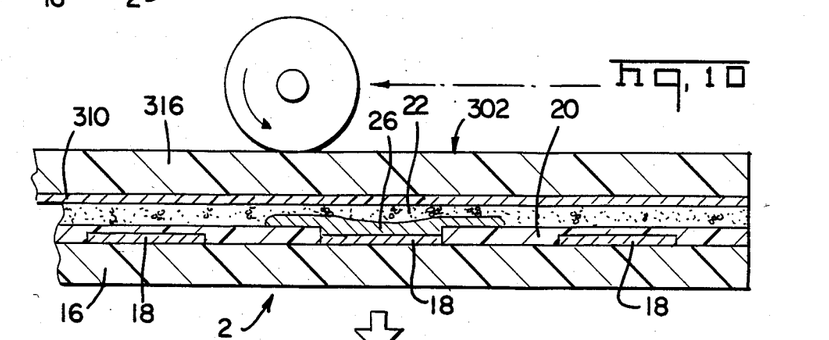
FIG. 10 is a view similar to FIG. 9 but showing the cables mated employing a pressure sensitive conductive adhesive.
Figure 11:
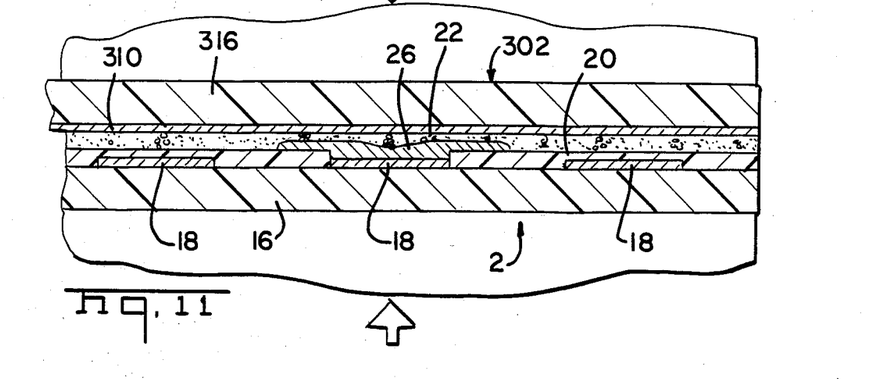
FIG. 11 is a view similar to FIG. 10 but showing the use of a heat activated conductive adhesive.
Figure 20:
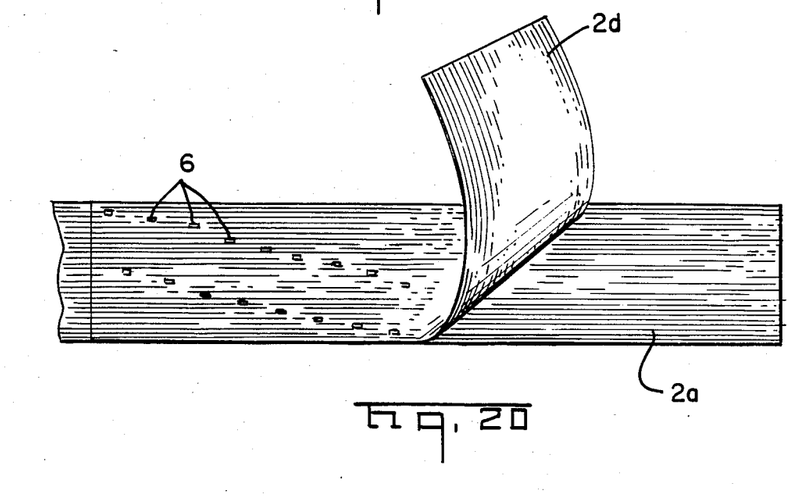
FIG. 20 is a top plan view illustrating a cable tap longitudinally to a similar cable.

FIG. 1 shows a pair of multiconductor flat cables 2a and 2b containing flat conductors, each attached to a common electrical connector 4 of conventional construction. A third or tap cable 2c extends at right angles to cable 2b. Interconnections with individual corresponding conductors in cables 2b and 2c are made at a plurality of predisposed tap locations 6 in the cable. Various embodiments of this invention are shown and described herein including the preferred embodiment of FIGS. 1 through 8. FIGS. 6 through 8 depict the interconnection of a preferred cable 2 with an essentially identical cable 102. FIGS. 9 through 11 depict the manner of establishing an interconnection between a cable of the preferred embodiment 2 and a separate conductor array 302 which could comprise a conventional flat cable or an array of conductors disposed upon either a flexible or a rigid substrate. The conductor array 302 in FIGS. 9 through 11 characterized in that the individual conductors 310 disposed on one surface of an insulating substrate 311 are exposed. FIGS. 15 through 18 describe an alternate embodiment of this invention which comprises a flat cable 402 having a generally laminate configuration including an insulating substrate 416 and a dielectric film coating 420. FIG. 20 demonstrates the manner in which a parallel tap interconnection can be established between two identical cables 2a and 2d each of which comprise the preferred embodiment of this invention.

Figure 2:
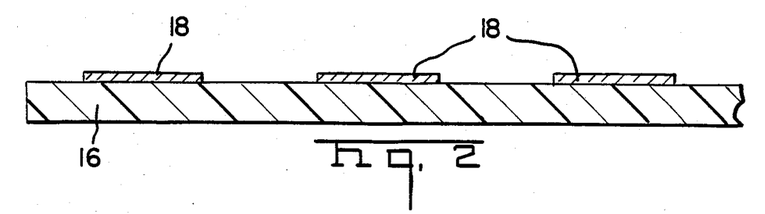
FIG. 2 is a sectional view taken along section lines 2—2 of FIG. 1.

The construction of th preferred embodiment of this invention can be understood by one skilled in the art from an examination of a plurality of sectional views shown in FIG. 2 through 5 in conjunction with reference to the plan view shown in FIG. 1. Cable 2 as shown in FIG. 1 comprises a plurality of longitudinally distinct segments. A section 22 adjacent the end of the cable and shown in FIG. 2 shows that the cable is formed from an insulating substrate 16 having a plurality of conductive traces 18 spaced apart and disposed on one surface thereof. In the preferred embodiment of this invention these conductive traces 18 comprise conductive ink traces having a conductive material interspersed in a solidified polymer. The conductors 18 in the preferred embodiment extend parallel and are spaced apart by a distance sufficient to maintain electrical integrity. These conductive ink traces 18 may be disposed upon the upper surface of insulating film 16 by a conventional silk screen or screen printing operation. The insulating film 16 can comprise a conventional dielectric film such as a polyester film, a polyvinyl, a polyetherimide, a polyimide film or a polycarbonate film. The exposed conductors 18 adjacent one end only of the film would normally be provided for test purposes during the manufacture of the cable. It should be understood that the exposed conductors in the vicinity of section 2 would be terminated to a separate electrical connector or would be severed in actual use.

Figure 3:
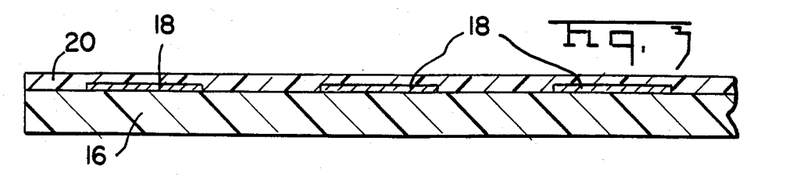
FIG. 3 is a sectional view taken along the section lines 3—3 of FIG. 1.

FIG. 3 shows a sectional view along a portion of the cable spaced from both ends. The construction of the cable as shown by section 3 would constitute the construction of the cable over the majority of its length provided that a tap interconnection is not desired along the majority of the length of the cable. A tap interconnection in accordance with this invention cannot be made to the cable at locations in which the cable has a construction such as that shown in FIG. 3. The conductive traces 18 shown in FIG. 3 are the same as the conductive traces 18 shown in FIG. 2 and are disposed on a surface of an identical insulating film 16. A dielectric coverlay 20 extends along the upper surface of film 16 and encapsulates the individual conductive traces between film 16 and the dielectric cover 20. In the preferred embodiment of this invention, the dielectric cover 20 comprises a dielectric coating comprising a dielectric ink formed of a photopolymer and having desirable insulating properties. Coating 20 is sufficiently flexible to maintain electrical integrity as the flat cable including film 16 is flexed during actual use. Dielectric coating 20 can be screen printed on film 16 in essentially the same manner as the conductive ink traces 18, and dielectric coating 20 can be cured to provide a solid film coating for the cable.

Figure 4:
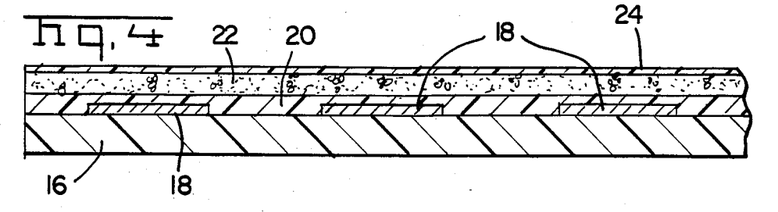
FIG. 4 is a sectional view taken along the section lines 4—4 of FIG. 1.

In those areas where an electrical interconnection is desirable to a separate conductor array such as a similar flat cable having a plurality of conductors, a conductive film 22 may be deposited on the surface of the dielectric coverlay 20. For example in the area 12 of cable 2 the three-layer cable of FIG. 3 is covered by a continuous layer 22 of conductive adhesive. This conductive adhesive 22 is also screen printable and in the preferred embodiment an anisotropic adhesive such as that disclosed in U.S. patent application Ser. No. 601,836 filed Apr. 19, 1984 entitled Anisotropically Conductive Adhesive Composition and commonly assigned with the instant application is employed. The preceding patent application is herein incorporated by reference and contains a suitable description of the anisotropic adhesive which provides electrical continuity in one direction only. Although the sectional view shown in FIG. 4 is taken within an area 12 in which a tap interconnection to a separate conductor array is desired, FIG. 4 is not taken along a tap location where an interconnection can be made to a corresponding conductor array. FIG. 4 also shows a silicone coated slip sheet or release liner 24 which can be placed along the non-tacky, dry conductive adhesive 22. The silicone coated slip sheet or release liner can be peeled from the interconnection area 12 when it is desired to make a tap connection. A separate insulating screen printed coverlay can also be provided over the conductive adhesive, provided the conductive media is exposed when the tap connection is completed by application of heat and/or pressure.

Figures 5, 12, 13, 14:
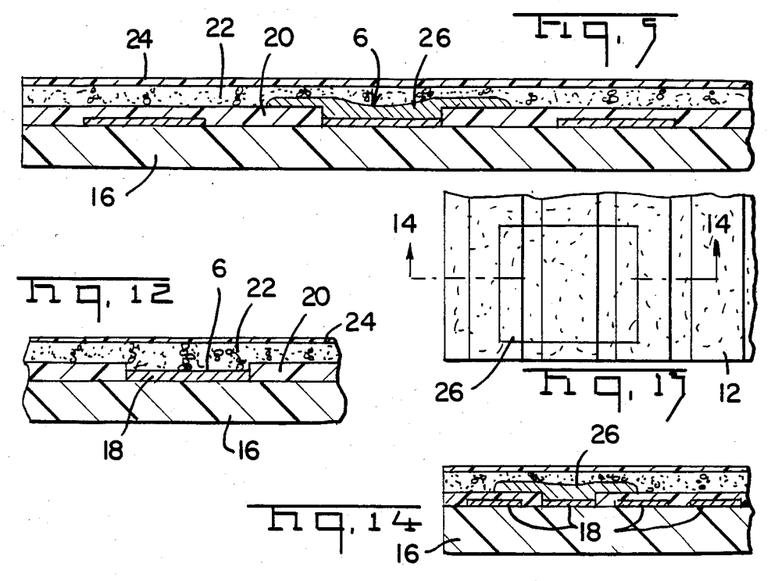
FIG. 5 is a sectional view taken along section lines 5—5 of FIG. 1.
FIG. 12 is a fragmentary cross-sectional view showing an exposed conductor at a tap location.
FIG. 13 is a fragmentary top plan view of a segment of the cable in which a conductive pad has been established to enlarge the tap area for a single trace.
FIG. 14 is a sectional view taken along section lines 14—14 of FIG. 13.

FIG. 5 is a section view taken along one of the predetermined tap locations 6 where a conductor 18 can be exposed both to the conductive adhesive 22 and ultimately to a conductive array to be interconnected thereto. Tap locations 6 are predetermined and in the preferred embodiment of this invention a staggered row of conductive traces 6 is chosen which can in turn be positioned in registry with a separate set of staggered tap locations 6 and a right angle tap cable 2c shown in FIG. 1. In the preferred embodiment of this invention a conductor pad 26 is formed over a conductor 18 at a tap location 6. This conductor pad can comprise a conductive ink similar to the conductive ink forming the trace conductors 18 and provides an enlarged area in which to make an interconnection through the anisotropic conductive adhesive 22. Since the dielectric film 20 can be screen printed onto substrate 16 and over conductors 18, the predetermined tap locations 6 can be easily defined during the screen printing operation and comprise those exposed locations at which a dielectric ink coating 20 is not deposited. Conductive pads 26 extend along the upper surface of the coating 20 both to provide additional surface area in which the connection can be made to the anisotropic conductive adhesive 22 and to provide a section in the conductive adhesive having a smaller thickness. The enlarged conductive pad also provides for a greater target area, thus facilitating a registration between tap locations on separate interconnected conductors.

FIGS. 6 through 8 demonstrate the manner in which a solderless tap interconnection can be established between two identical cables 2 and 102 at prescribed tap locations 6 and 106 through conductor pads 26 and 126 and through layers of conductive adhesive 22 and 122. First the release liners 24 and 124 are removed from the surface of the cable in the region 12 where a tap interconnection is to be made. As shown in FIG. 7, a pressure sensitive adhesive interconnection can be made by placing conductive pads 26 and 126 in registry and merely applying pressure to fuse the conductive adhesive layers 22' and 112' which comprise a pressure sensitive conductive adhesive. A suitable pressure sensitive conductive adhesive is described in U.S. patent application Ser. No. 601,836 filed Apr. 19, 1984 and entitled Anisotropically Conductive Adhesive Composition and commonly assigned with the instant application. The proceeding patent application is hereby incorporated by reference. A similar configuration of identical cables is shown in FIG. 8 wherein the conductive adhesive 22' and 122' comprises an adhesive which must be actuated by both heat and pressure. Suitable heat actuated conductive adhesive and the method of activating this conductive adhesive is described in the above-identified patent application.

Use of an anisotropic conductive adhesive which establishes electrical continuity perpendicular to the plane of the cable but does not establish electrical continuity in a lateral direction is the preferred form of conductive adhesive for use in the instant application. When an anisotropic conductive adhesive is employed, the conductive adhesive can merely be screen printed on the surface of the cable throughout the location 12 which electrical continuity is to be established. If a biaxial conductive adhesive were employed, deposition of the conductive adhesive would be limited to areas of individual tap locations 6, and unless a bridging interconnection were to be established, separate dots of conductive adhesive must be deposited on each individual tap location. Use of an anisotropic adhesive obviates the necessity of depositing the conductive adhesive only in dots on the film independently in registry with individual tap locations. Of course if a bridged interconnection between a plurality of tap locations were desired when an anisotropic conductive adhesive was employed, suitable printing of the dielectric coating, leaving the prescribed bridged locations commonly exposed could be established and a commoning conductive pad formed with a conductive ink could be screen printed to join the connectors. Indeed non-adjacent connectors could be commoned by depositing a conductive ink over the surface of a layer of dielectric coating covering the intermediate conductors.

FIGS. 9 through 10 are similar to FIGS. 9 through 8 but show the manner in which a single flat cable 2 in accordance with the preferred embodiment of this invention can be attached to a dissimilar conductor array 302 which could be formed by an insulating substrate 316 having a plurality of conductors, one of which 310 is shown herein, would be positioned. Such dissimilar conductor array could comprise a printed circuit board, a flat cable without a dielectric coating, or with the dielectric coating removed, or an insulating substrate having a conductive ink pattern formed thereon. Again the conductive adhesive in cable 2 could comprise a pressure sensitive adhesive, in which case interconnection would be formed in the manner shown in FIG. 10 or a heat and pressure actuated conductive adhesive in which case the interconnection is depicted in FIG. 11.

FIGS. 12 through 14 demonstrate the versatility of the preferred embodiment of this invention. For example FIG. 12 illustrates a tap location 6 in which interconnection is made directly between the conductive adhesive 12 in the underlying but exposed conductor 18. No conductive pad is depicted in FIG. 12. FIGS. 13 and 14 however disclose a separate configuration in which the conductive pad 26 is positioned not only between conductor 18 and conductive adhesive 22 but in which the conductive pad 26 overlies the dielectric 20 covering adjacent connectors, thus greatly enlarging the area in which registration can be established.

Figure 15:
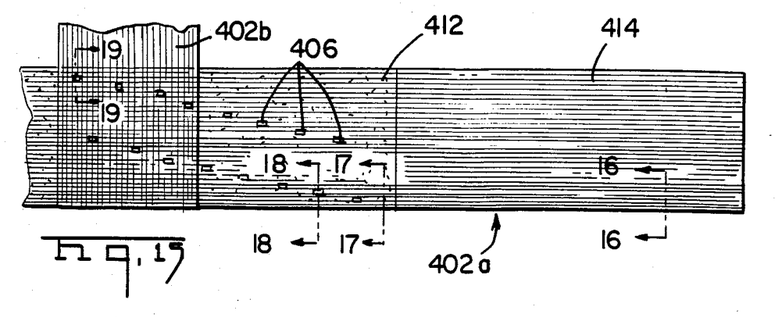
FIG. 15 is a top plan view of a cable employing metallic traces on an insulating substrate with a laminated top insulating layer.
Figure 16:
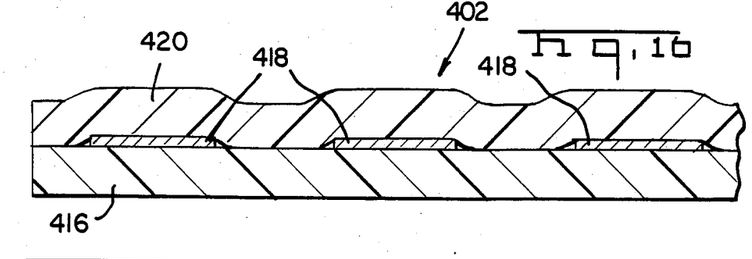
FIG. 16 is a view taken along section lines 16—16 of FIG. 15.
Figure 17:
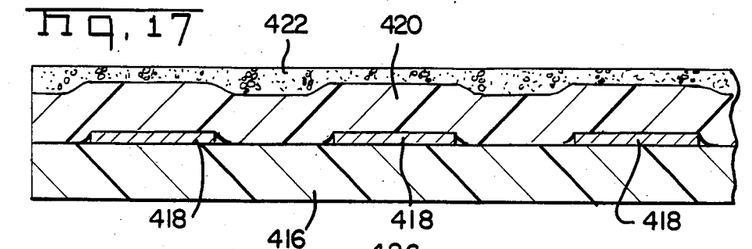
FIG. 17 is a sectional view taken along section lines 17—17 of FIG. 15.
Figure 18:
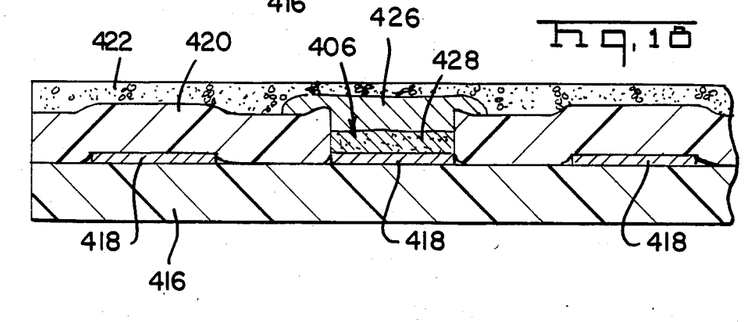
FIG. 18 is a sectional view taken along section lines 18—18 of FIG. 15.
Figure 19:
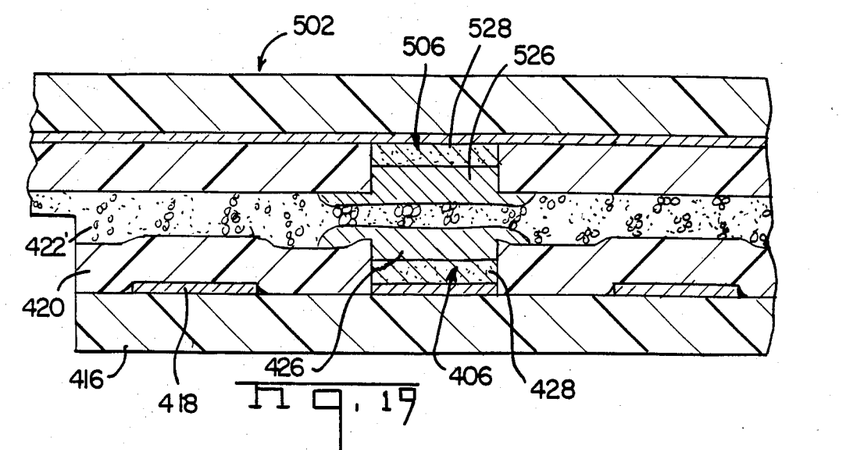
FIG. 19 is a cross-sectional view of the cable as shown in FIG. 18 mated to a similar cable.

It should of course be understood that the tap interconnection aspect of this invention is not limited to a cable configuration such as that shown in FIGS. 1 through 14. FIGS. 15 through 19 illustrate a cable 402 which is fabricated in a somewhat different manner. FIG. 15 discloses a right angle tap interconnection between two identical cables 402a and 402b. Cable 402a has a first section 414 which is depicted in the cross section 16 which was taken along section lines 16—16. This portion of cable comprises a laminated configuration having a first lower insulated film 416 with an upper or second insulating film 420 adhered thereto by conventional laminating means. The conductors 418 can comprise metallic conductors such as formed copper traces or etched copper traces deposited on dielectric film 416 by conventional means. A tap region 412 can be defined on the surface of cable 402 by the deposition of an anisotropic adhesive 422 having the same composition or choice of compositions as previously described. In order to define individual tap locations 406 in registry with the conductors 418 within the tap region 412, portions of the upper laminated film in registry with the conductors 418 must be removed. Removal of the insulating film 420 above conductors 418 at tap locations 406 should be conventionally accomplished by the use of a laser cut. Such a tap location 406 is shown in FIG. 18 which comprises a cross-sectional view taken along sections 18—18. Where a copper conductive trace is employed a first solder layer 428 comprising a lead tin solder is first deposited over the copper conductor 418 to prevent oxidation and the buildup of a contaminating insulating layer. A conductor pad 426 formed with conductive ink such as that employed with the first embodiment of this invention can then be deposited by conventional screen printing means over the solder layer 428 and overlapping portions of the insulation 420. Of course the solder layer 428 and the conductive pad 426 must be deposited prior to deposition of the anisotropic conductive layer 422. FIG. 19 illustrates the interconnection between two identical cables 402 and 502 such as that depicted in FIGS. 15 through 18 in which tap locations 406 and 506 are placed in registry and the conductive adhesive layers bonded by one of the previously described methods.

Although the invention has been described in terms of a right angle tap interconnection between two flat cables, it should be understood that the invention is in no means limited to such a configuration. For example the flat cable having the predescribed tap locations could be attached to a separate component, a separate printed circuit board or could be attached to a parallel cable in the manner shown in FIG. 20 where cables 22a and 2d are interconnected by placing tap location 6 in registry. Of course the use of anisotropic adhesive deposited completely within a region such as tap region 12 provides a wide area for adhesion between two interconnected assemblies. Thus a secure interconnection can be established.

Several specific non-limiting examples of the various inks applied to the substrate will now be described. As noted above, the conductive traces 18 are preferably applied on the substrate in the form of a polymeric conductive ink, and specifically a silver containing solvated polyester resin, which is then dried. In addition to polyester, the polymer may comprise an epoxy, acrylic, polycarbonate, polyimide, polyurethane, or polyvinyl resin. The solvent serves to dissolve the polymer, and may be dried by the application of heat to remove the solvent and bond the polymer to the substrate. Butyl cellesolve acetate, and glycol ethers and their derivatives are commonly used solvents. As a specific example of a suitable ink, the conductor ink may be formulated as follows:

| Ingredient | Percentage (by weight) |
| --- | --- |
| Silver | 60% |
| Polyester resin | 15% |
| Butyl cellesolve acetate | 25% |

The conductor ink sold under the designation "5007" by DuPont is suitable for use with the present invention. Also, the above inks are adapted to be applied to the substrate by screen printing, which is the preferred method of application.

Thermoset or crosslinkable conductive inks may also be used. The conductive ink sold under the designation "CT 5030" by Amicon Corp., Lexington, Mass., is one such ink suitable for use with the present invention. It is a silkscreenable ink comprised of silver dispersed in an epoxy resin.

The composition of the dielectric coating 24 also preferably has a formulation which permits it to be applied by a screen printing operation, and in addition, it should have a desirable degree of flexibility and the ability to adhere to the material of the substrate.

The concurrently filed, copending, and commonly owned U.S. patent application, Ser. No. 728895, filed Apr. 30, 1985 *Photocurable Dielectric Coating*, AMP Docket No. 13401 describes the present invention. The preceeding patent application is herein incorporated by reference. One particularly suitable formulation for a flexible film substrate is as follows:

| Ingredient | Percentage (by weight) |
| --- | --- |
| FLEXCOAT (W. R. Grace) | 68.38% |
| Diallyl phthalate | 5.47% |
| Photoinitiator | 1.37% |
| n-vinyl pyrollidine | 8.21% |
| Acrylated urethane prepolymer System | 16.47% |
| Additive-adhesion promotor | 0.10% |
| | 100% |

FLEXCOAT is a trademark of W. R. Grace, New York, N.Y., for a screen printable photopolymer solder resist which rapidly cures through the application of ultraviolet light, and which forms a tough protective film over the circuitry. The added ingredients provide improved printability, flexibility and adhesion properties. The plasticizer, diallyl phthalate is added to increase the flexibility of the dielectric coating 24 so that the coating 24 will not crack or craze when the substrate to which it is applied is flexed or is subject to thermal expansion. One source for diallyl phthalate is Fisher Scientific Co., Pittsburgh, Pa., n-vinyl pyrollidine is a monofunctional acrylate monomer added to control shrinkage of the cured dielectric coating 24. This monomer is available under the trade name V-PYROL from GAF Corporation, New York, N.Y. The acrylated urethane prepolymer used in the above example is available under the trade name PURELAST 169, from Polymer Systems Corporation, New Brunswick, N.J. This polymer was added to increase the flexibility of the coating IRGACURE 651 available from Ciba Geigy Corporation, Ardsley, N.Y., was used as the photoinitiator. The adhesion promotor was A186 available from Union Carbide Corporation, Danbury, Conn.

The copending and commonly owned U.S. patent application Ser. No. 601,836, filed Apr. 19, 1984, describes several embodiments of an anisotropically conductive adhesive suitable for use with the present invention. Generally, the adhesive may be made by mixing electrically conductive particles with a non-conductive adhesive binder. The percent by volume and size of the particles are selected so that the particles are dispersed randomly throughout the mixture as non-contiguous conductive units, with each unit being comprised of one or a plurality of individual particles. The units are sufficiently spaced apart to preclude electrical conductivity between two or more adjacent conductive areas on the same substrate, but the number of particles is sufficient so that the conductive units provide an electrical contact between the conductive areas on two mating substrates.

The following example illustrates one method of preparing an anisotropically conductive adhesive as described in the above copending application, and which is suitable for use with the present invention. In this preferred example, 15.82 grams of silver coated nickel spheroids (8 micron diameter, 15% by weight silver) were mixed with 100 grams of a solvated polyester resin blend (33% by weight solids). This resulted in a hot melt anisotropically conductive adhesive composition having 5% by volume of silver coated spheroids. Mixing may be accomplished with a propeller type stirrer at moderate rotations per minute for approximately 15 minutes. Immediately after stirring, the mixture may be screen printed using a 105 mesh stainless steel screen, and the unwanted solvents may be driven off by heating at 125° C. for 30 minutes. The resulting adhesive film is substantially dry and non-tacky at room temperature. Also, the resulting dry layer of adhesive possesses a desirable degree of compliance, which is important in permitting accommodation of different coefficients of thermal expansion between the substrate and components.

A suitable solvated polyester resin blend for use in the above example may be obtained from KC Coatings, Inc. of Lenexa, Kans., and is sold under their designation "9627 Mylar Clear." MYLAR is a trademark of E. I. DuPont de Nemours and Co., Inc. More particularly, "9627 Mylar Clear" comprises 29% by weight of a polyester resin, and the solvent comprises 59% Butyrolactone and 41% of an aromatic solvent blend SC 150.

Although the invention has been described in terms of a number of specific embodiments, the invention is in no way limited to the embodiments described herein, since one skilled in the art could employ embodiments differing in detail but not departing from the inventive concept disclosed and claimed herein.

What is claimed is:

1. A multiconductor flat cable comprising a flexible insulating substrate; a plurality of conductors disposed thereon, the conductors comprising a conductive ink comprising a solidified polymer having conductive material dispersed therein; and a dielectric coating overlying the conductors, the dielectric coating comprising a flexible solidified dielectric ink, the conductive ink solidified polymer and the solidified dielectric ink each being curable from a solvated state in which the conductive ink and dielectric coating were screen printable.

2. The cable of claim 1 wherein the dielectric coating adheres to the insulating substrate between the conductors.

3. The cable of claim 2 wherein the dielectric ink comprises a solidified polymer curable from a solvated state by radiation.

4. The cable of claim 3 wherein the dielectric ink comprises a solidified photopolymer curable from a solvated state by the application of ultraviolet light.

5. The cable of claim 3 wherein the dielectric ink comprises a solidified photopolymer curable from a solvated state by the application of electron beam radiation.

6. The cable of claim 3 wherein the conductive ink comprises a conductive material containing a resin vehicle.

7. The cable of claim 6 wherein the conductive ink comprises a conductive material containing a polyester resin vehicle.

8. The cable of claim 6 the conductive ink is solidified upon the application of heat.

9. The cable of claim 1 wherein the flexible insulating substrate is formed from a material selected from the group including a polyester film a polyimide film and a polycarbonate film.

10. The cable of claim 1 wherein the dielectric coating is selectively discontinuous, being disposed over portions only of the conductors, other portions of the conductors being thereby exposed, the cable further comprising a layer of conductive adhesive disposed over the exposed conductors.

11. The cable of claim 10 wherein the conductive adhesive is flexible.

12. The cable of claim 10 wherein the conductive adhesive includes a thermoplastic resin.

13. The cable of claim 10 wherein the conductive adhesive comprises an anisotropic conductive adhesive.

14. The cable of claim 1 wherein the dielectric ink is thermally curable.

15. A multiconductor cable adapted to form a tap connection with corresponding conductors in a separate conductor array, comprising: a flexible insulating substrate; a plurality of conductors disposed thereon; a dielectric coating overlying the conductors, the dielectric coating being selectively discontinuous and being disposed over portions only of the conductors, other portions of the conductors comprising exposed tap locations; a conductive ink pad comprising a solidified polymer having a conductive material disposed therein overlying the conductor at at least one tap location; and a conductive adhesive disposed over the exposed tap locations, whereby corresponding conductors disposed in registry with the tap locations can be interconnected to the conductors in the cable by the conductive adhesive.

16. The cable of claim 15 wherein a conductive ink is located at each tap location, the conductive ink comprising a solidified polymer having conductive material disposed therein, the conductive adhesive being disposed over the conductive ink.

17. The cable of claim 15 wherein the conductors comprise conductive ink comprising a solidified polymer having conductive material disposed therein.

18. The cable of claim 15 wherein the conductors comprise copper conductors affixed to the flexible substrate.

19. The cable of claim 18 wherein the conductors comprise copper conductors affixed to the flexible substrate, the cable further comprising solder disposed between the conductors and the conductive ink pad at each tap location.

20. The cable of claim 19 wherein the dielectric coating comprises a flexible film.

21. The cable of claim 20 wherein the tap locations are defined by laser cuts through the flexible film to expose the conductive traces.

22. The cable of claim 15 wherein at least two of the conductors are laterally adjacent, the first laterally adjacent conductor extending through a tap location, the second laterally adjacent conductor being covered by the dielectric coating adjacent the tap location, a conductive ink pad at the tap location extending laterally beyond the conductor extending through the tap location.

23. The cable of claim 22 wherein a portion of the conductive ink at each tap location overlaps the dielectric coating.

24. A multiconductor cable adapted to form a tap connection with corresponding conductors in a separate conductor array, comprising: a flexible insulating substrate; a plurality of conductors disposed thereon; a dielectric coating overlying the conductors, the dielectric coating being selectively discontinuous and being disposed over portions only of the conductors, other portions of the conductors comprising exposed tap locations; and a conductive adhesive disposed over the exposed tap locations, whereby corresponding conductors disposed in registry with the tap locations can be interconnected to the conductors in the cable by the conductive adhesive, the conductors, the dielectric coating and the conductive adhesive comprising solidified polymers cured from a solvated state in which the conductive ink, dielectric coating and conductive adhesive were screen printable.

* * * * *